United States Patent
Yoshida

(10) Patent No.: US 7,183,718 B2
(45) Date of Patent: Feb. 27, 2007

(54) LIGHT-EMITTING DEVICE

(75) Inventor: Yohei Yoshida, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 228 days.

(21) Appl. No.: 10/754,418

(22) Filed: Jan. 8, 2004

(65) Prior Publication Data

US 2004/0145301 A1    Jul. 29, 2004

(30) Foreign Application Priority Data

Jan. 10, 2003  (JP)  ............... 2003-004480
Oct. 3, 2003   (JP)  ............... 2003-346087

(51) Int. Cl.
*H05B 37/02*    (2006.01)

(52) U.S. Cl. .................. 315/153; 315/158; 315/297

(58) Field of Classification Search ............... 313/498; 250/205; 345/87; 315/153, 158, 297
See application file for complete search history.

(56) References Cited

U.S. PATENT DOCUMENTS

| | | | | |
|---|---|---|---|---|
| 5,471,052 A | * | 11/1995 | Ryczek | .................. 250/226 |
| 6,043,893 A | * | 3/2000 | Treiman et al. | ............. 356/402 |
| 6,069,676 A | * | 5/2000 | Yuyama | ...................... 349/62 |
| 6,081,073 A | * | 6/2000 | Salam | ..................... 315/169.2 |
| 6,127,783 A | * | 10/2000 | Pashley et al. | ............. 315/149 |
| 6,157,453 A | * | 12/2000 | Tamanti et al. | ............. 356/406 |
| 6,373,568 B1 | * | 4/2002 | Miller et al. | ................. 356/326 |
| 6,674,530 B2 | * | 1/2004 | Berstis | ........................ 356/406 |
| 6,741,351 B2 | * | 5/2004 | Marshall et al. | ............ 356/406 |
| 6,888,323 B1 | * | 5/2005 | Null et al. | ................... 315/294 |
| 6,952,002 B2 | * | 10/2005 | Hashimoto | .................. 250/205 |

FOREIGN PATENT DOCUMENTS

| | | |
|---|---|---|
| JP | 5-21458 | 3/1993 |
| JP | 6-79165 | 11/1994 |
| JP | 07-038154 | 2/1995 |
| JP | 09-234728 | 9/1997 |
| JP | 11-087780 | 3/1999 |

* cited by examiner

*Primary Examiner*—Edward J. Glick
*Assistant Examiner*—Thomas R. Artman
(74) *Attorney, Agent, or Firm*—Morrison & Foerster LLP

(57) ABSTRACT

A light-emitting device includes a plurality of light-emitting elements, particularly three light-emitting diodes and one phototransistor, and acquires excellent white color characteristics. A plurality of light-emitting elements and one light-detecting element are provided onto a substrate. Particularly, one each light-emitting elements for emitting each of first, second and third color is provided and one light-detecting element detects light emitted from each of the light-emitting elements.

5 Claims, 8 Drawing Sheets

LIGHT-EMITTING DEVICE

CROSS-REFERENCE TO RELATED APPLICATIONS

This application is related to Japanese patent application Nos.2003-004480 filed on Jan. 10, 2003 and 2003-346087 filed on Oct. 3, 2003, whose priorities are claimed under 35 USC § 119, the disclosures of which are incorporated by reference in their entirety.

BACKGROUND OF THE INVENTION

1. Field of the Invention

This invention relates to a light-emitting device for generating light of a predetermined color such as light of a white color by use of a plurality of light-emitting elements (LED: Light Emitting Diode), particularly three LED of a red color (R), a green color (G) and a blue color (B).

2. Description of the Related Art

A light source using a combination of the three primary colors of a red color (hereinafter called "R"), a green color (hereinafter called "G") and a blue color (hereinafter called "B") has been utilized as a white color light source generated by synthesizing the three primary colors. An LED for realizing a pseudo-white color by combining blue color light and a fluorescent substance excited by blue color light and generating red color light is also known.

The white color light source has been used as a backlight of a liquid crystal display device (LCD) of a cellular telephone unit, or the like.

To emit white color light by use of the LED of the three primary colors, it is necessary to appropriately select the arrangement of the LED of the three primary colors and light intensity and to appropriately adjust the color balance of the three primary colors for avoiding color shift. Various proposals have been made as far as to the arrangement of the three LED and the light-emitting methods (refer to patent references 1 and 2).

Patent Reference 1: Japanese Unexamined Utility Model Publication No. Hei 6(1994)-79165

Patent Reference 2: Japanese Unexamined Utility Model Publication No. Hei 5(1993)-21458

Patent reference 1 discloses an LED lamp having a construction in which one red LED is arranged at a center and two green LED and two blue LED are so arranged as to be mutually symmetric for each display color with the red LED being the center.

Patent reference 2 discloses a semiconductor light-emitting device having a construction in which one red LED is disposed at a center of a square and two green LED and two blue LED are alternately disposed at the four corners of the square.

When LED of the three primary colors are used to create a light source of a desired color, the color of each LED, the color balance and light intensity are important factors to keep display color quality of the desired color and to prevent color shift. Particularly, a light intensity ratio of each color determines the tone of the color.

It is difficult to completely fabricate the LED chip of each of R, G and B as designed. When a plurality of LED of the same color is used or when a large number of different LED are used to create a light emission color of the same color tone, deviation of the color balance occurs from product to product.

In the case of a white color, in particular, it is of importance to create the color tone as designed because the atmosphere of a room under a daylight color, a lamp color, etc, changes when the color tone changes.

A degradation speed of each LED with the passage of time is different. Due to this difference, differences also occur in the color and the color balance in the course of use of the light-emitting device for a long time and the color tone of the light emission color changes.

To cope with this change with time, it is believed that it is desirable to dispose a light intensity monitor chip for each LED, to adjust the light emission intensity of each LED while the light intensity of each LED is always measured, and thus to keep quality of the light emission color. When the light intensity monitor chip is individually disposed for each LED, however, the number of components for monitoring the light intensity increases, the circuit becomes more complicated and the size of a package becomes greater. Therefore, this construction is not suitable for the application for which a compact size is particularly requisite.

SUMMARY OF THE INVENTION

The invention provides a light-emitting device including, on a substrate, a plurality of light-emitting elements for emitting light having different colors, respectively, and one light-detecting element for detecting light emitted from each of the light-emitting elements.

Here, n (n≧2) light-emitting elements may well be disposed but the n light-emitting elements emit light having mutually different colors.

The invention provides a light-emitting device including one each light emitting elements for emitting light of each of first, second and third colors, and one light-detecting element for detecting light emitted from each light-emitting element.

In the invention, since the light-detecting element is arranged in the proximity of each light-emitting element, the intensity of light emitted from the light-detecting element can be correctly monitored and light emission color having a desired color balance can be acquired. Particularly, desired white color light can be obtained stably. The number of components and the size of the device can be reduced, too.

DESCRIPTION OF THE PREFERRED EMBODIMENTS

Figure 1:
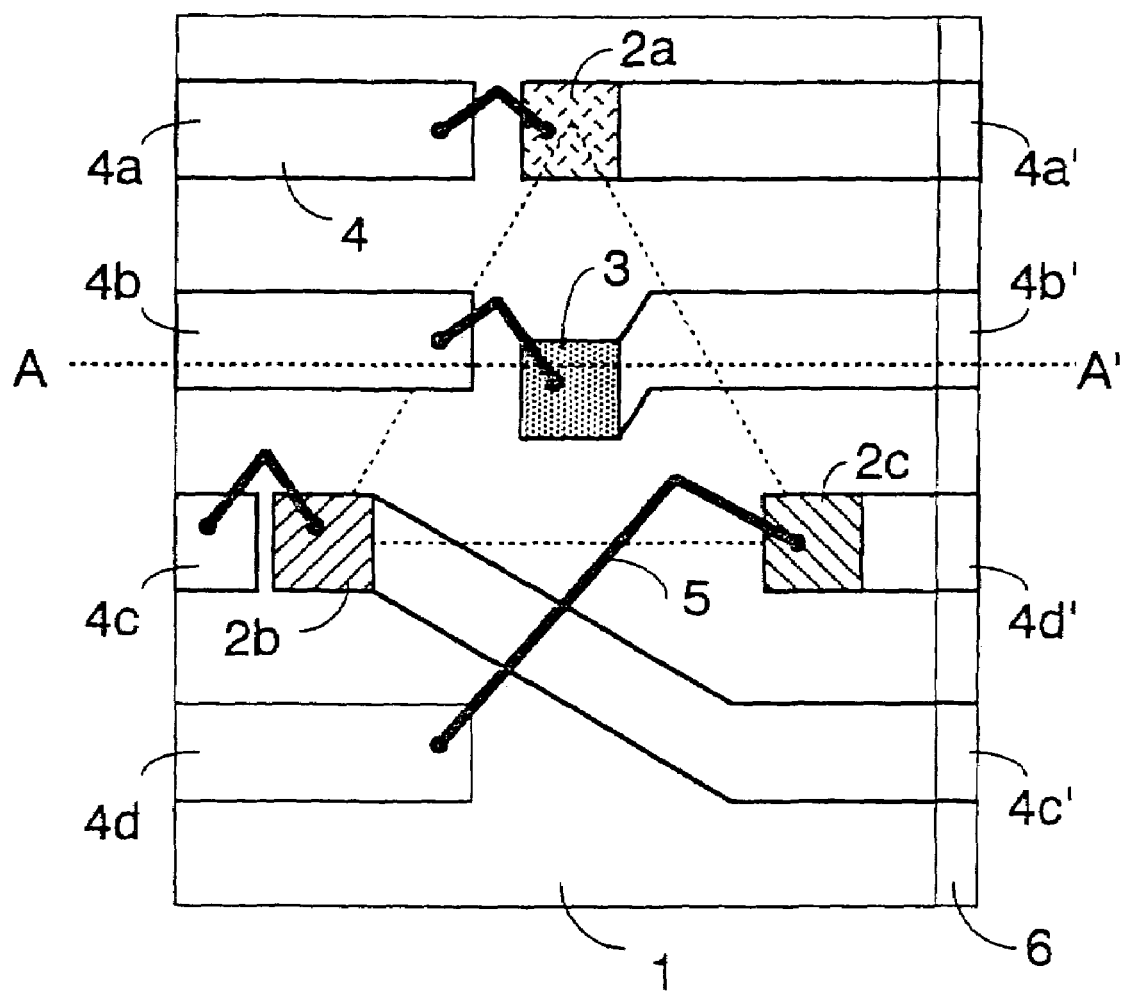
FIG. 1 is a structural view of a light-emitting device according to an embodiment of the invention.

The invention is aimed at providing a light-emitting device that includes one each LED (light-emitting diode) for emitting light of each of R, G and B colors and one phototransistor (light-detecting element) for detecting light intensity, keeps quality of an emission color while adjusting a color balance and can reduce a size of the device.

The light-detecting element is preferably arranged at a position substantially equidistant from the three light-emitting chips.

The light-emitting elements of the first, second and third colors may well be arranged at the respective apexes of an equilateral triangle, and the light-detecting element, at the center of gravity of the equilateral triangle. According to this arrangement, the proportion of light incident from each light-emitting element into the light-detecting element can be made substantially constant and the output of the light-detecting element becomes substantially equal for each color. Therefore, the gain of an amplifier in a subsequent stage can be made substantially equal and the construction of the light-emitting device can be simplified. Furthermore, the gap between the elements can be reduced to minimum and the device can be made compact in size.

Various elements may be used as the light-emitting elements, but LED can be used as the element that is compact and economical. LED for emitting light of three colors, that is, red, green and blue, are used to acquire white color light. A phototransistor is used as the light-detecting element, for example.

The invention provides further a light-emitting device including a light emission control portion for applying a predetermined current to the light-emitting elements described above and allowing the three light-emitting chips to serially emit light with a predetermined time interval among them, and a light intensity adjustment portion for serially receiving detection signals outputted from the light-detecting element described above in such a fashion as to correspond to the intensity of emitted light, analyzing the detection signals and adjusting the current to be applied to each light-emitting element so that predetermined white color light can be created.

Both light emission control portion and light emission intensity adjustment portion can be constituted by use of a hardware logic by combining logic elements, but a microcomputer including CPU, ROM, RAM, I/O controller, timer, and so forth, can be used, too. When the microcomputer is used, the ROM or the RAM stores in advance a program representing a current amount as the reference for the adjustment, a control sequence of light emission, and so forth.

It is also possible to allow the light emission control portion to detect external light incident into the light-detecting element in a time zone in which none of the light-emitting elements emit light and to allow the light intensity adjustment portion to adjust the current applied to each light-emitting element by use of the detection signal based on external light.

The three light-emitting chips may be arranged on an insulating substrate and the light-detecting element may be arranged in such a fashion as not to intercept emitted light. The light-detecting element may be arranged inside a recess formed in the insulating substrate, for example.

The light-emitting device according to the invention may be used as backlight of a liquid crystal display device, or the like.

The light-emitting device according to the invention includes, on a substrate, a plurality of light-emitting elements and one light-detecting element for detecting light emitted from the light-emitting elements and can therefore adjust easily a color balance of emitted light colors.

The light-emitting device according to the invention includes three light-emitting elements and one light-detecting element and makes contrivance to their arrangement. Therefore, the light-emitting device can restrict deviation of the color balance and can keep the tone of the light emission color synthesized by light emission of the three light-emitting elements, particularly the tone of white color light. Because the light-emitting device is constituted by a smaller number of components, it becomes possible to reduce the size of the light-emitting device and its production cost.

The current to be applied to the light-emitting elements is adjusted by use of the detection signal detected by the light-detecting element. Therefore, a light emission color having a desired color balance can be always acquired even when any deviation or deterioration occurs in the light emission characteristics of the light-emitting elements, and desired white color light can be acquired stably, in particular.

Furthermore, the light-detecting element detects external light. Therefore, the light intensity of white color light can be adjusted in such a fashion as to correspond to the light intensity of external light, and high quality display that is easy to watch for users can be provided.

<Structure of the Invention>

The invention will be hereinafter explained in detail on the basis of embodiments thereof shown in the drawings but is in no way limited thereto. The following embodiment explains the case where the number of light-emitting elements is 3.

FIG. 1 shows a structural view of a light-emitting device according to an embodiment of the invention.

Figure 2:
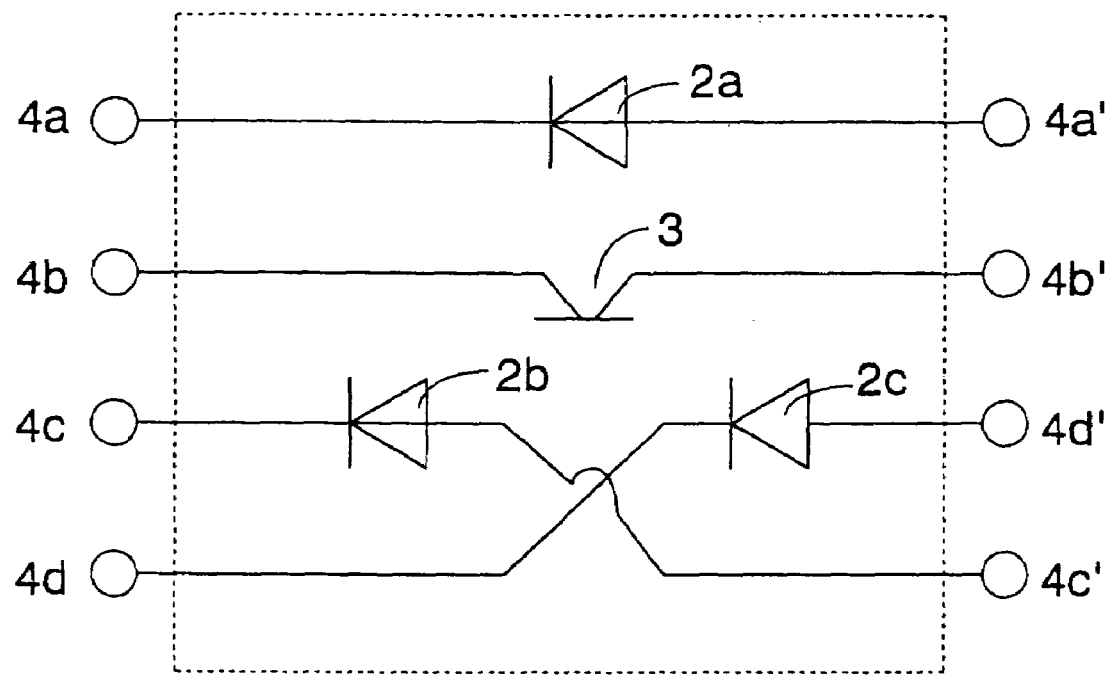
FIG. 2 is a circuit diagram corresponding to the arrangement of the light-emitting device shown in FIG. 1.

FIG. 2 shows a circuit diagram corresponding to the arrangement of the light-emitting device shown in FIG. 1.

Figure 3:
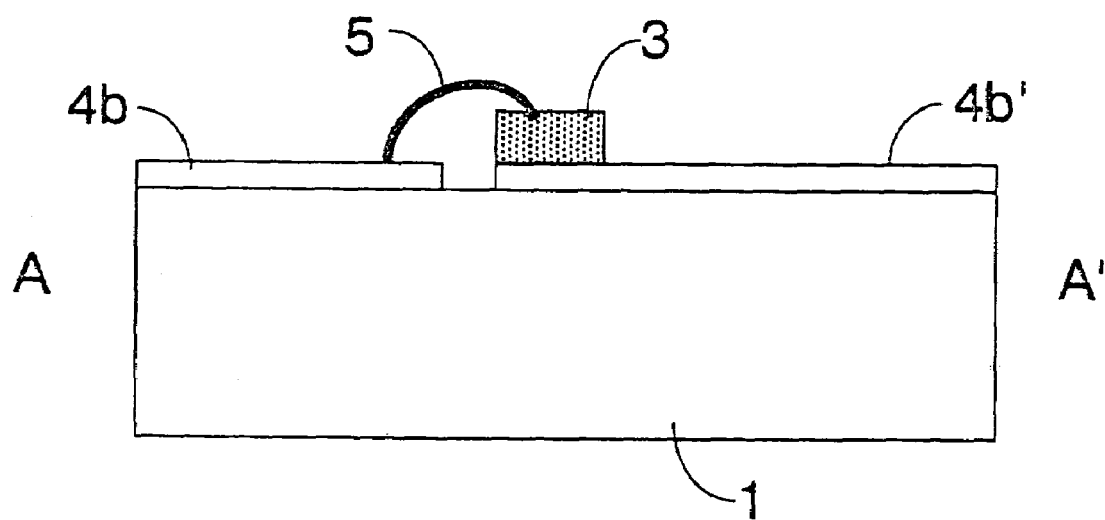
FIG. 3 is a sectional view of a section A–A' in FIG. 1.

FIG. 3 shows a sectional view of a section A–A' in FIG. 1.

The light-emitting device according to the invention includes three LED chips (2a, 2b, 2c) and one phototransistor 3 that are formed on one insulating substrate 1 as shown in FIG. 1.

These three LED chips are an LED 2a for emitting a red color, an LED 2b for emitting a green color and an. LED 2c for emitting a blue color and are arranged at the apexes of an equilateral triangle, respectively.

The one phototransistor 3 is arranged substantially at an equidistant position from each LED chip, that is, at the center of gravity of the equilateral triangle.

Wiring patterns 4 and wires 5 are formed on the insulating substrate 1 to apply a current to the LED chips (2a, 2b, 2c) and to the phototransistor 3. The wiring pattern 4 is an electrically independent wiring for each of the three LED chips and for the phototransistor.

In FIG. 1 the wiring pattern 4 electrically independent for each of the LED chips 2 and for the phototransistor 3 and the wires 5 for directly connecting these wiring patterns are shown formed.

Figure 4:
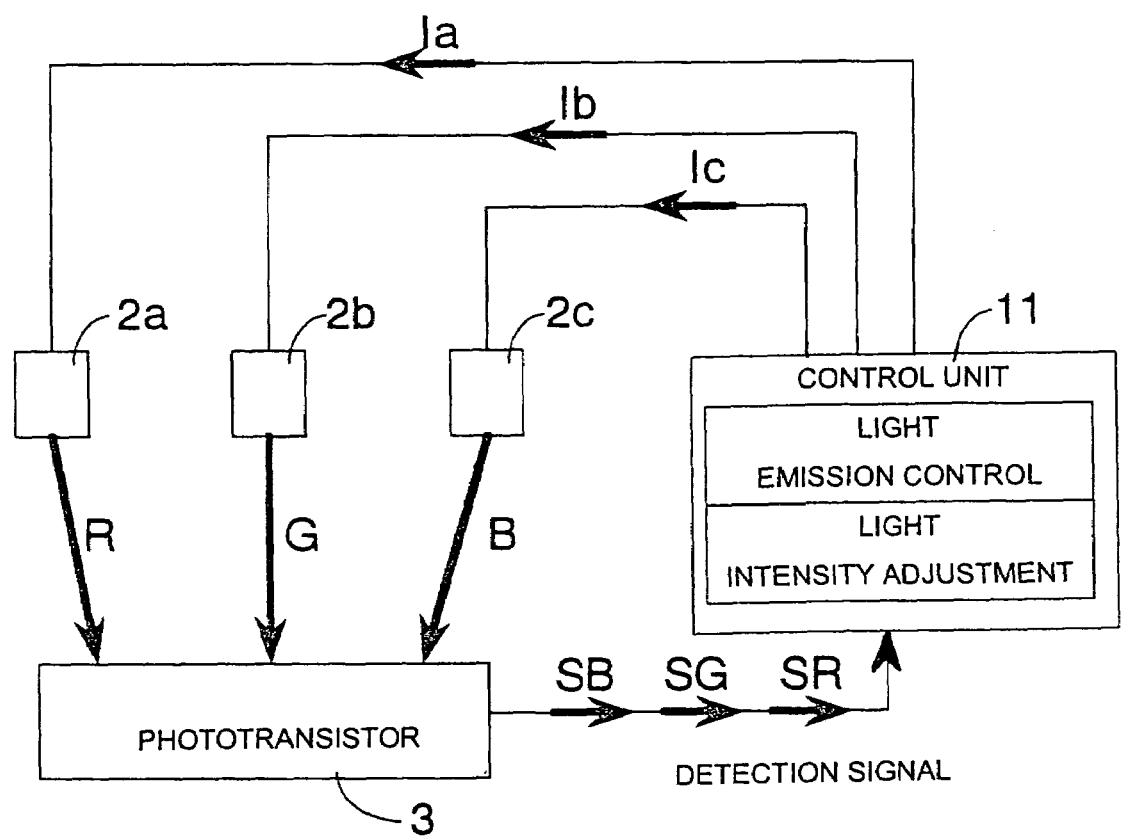
FIG. 4 is a schematic structural view of light emission control of the invention.

The wiring pattern (4a, 4c, 4d) connected to each LED chip is electrically connected to a control unit 11 shown in FIG. 4. The control unit 11 conducts ON/OFF control of the current flowing in each LED through this wiring pattern 4.

To protect the chips and to elevate a light diffusion, a resin protective film 6 is formed in such a manner as to cover the circuit as a whole with the exception of external contact portions of electrodes.

FIG. 2 expresses the display device shown in FIG. 1 by circuit symbols. When the current is caused to flow through the LED chips and the respective colors are emitted, the rays of light travel in all directions and one phototransistor 3 detects a part of such rays of light.

Because only one phototransistor 3 exists, control is made so as not to let the plurality of LED emit light simultaneously but to let these LED serially emit light on a time division basis.

In other words, only one LED is allowed to emit light at one time and the phototransistor 3 detects light from the one LED.

The wiring pattern (4b) connected to the phototransistor 3, too, is connected to the control unit 11 described above. The detection signal of the light intensity of each of the three LED outputted through the wiring pattern 4b is analyzed to adjust the current to be caused to flow through each LED.

FIG. 4 is a schematic structural view of LED light emission, light intensity detection and current control in this invention.

In FIG. 4, light emission of each of the R, G and B colors is made on the time division basis without overlapping with one another, and the detection signals SR, SG and SB are inputted as the signals deviated time-wise from one another to the control unit 11. The control unit 11 analyzes the size of the detection signals SR, SG and SB, adjusts the three light emission intensities of R, G and B so that white color light can be outputted as designed, and outputs currents (1a, 1b. 1c) corresponding to these intensities while they are deviated time-wise from one another.

The control unit 11 has a function of a light emission control unit for controlling the light emission timing and a function of a light intensity adjustment unit for analyzing the detection signal inputted from the phototransistor and calculating an adjustment value of the current corresponding to the light intensity.

Figure 5:
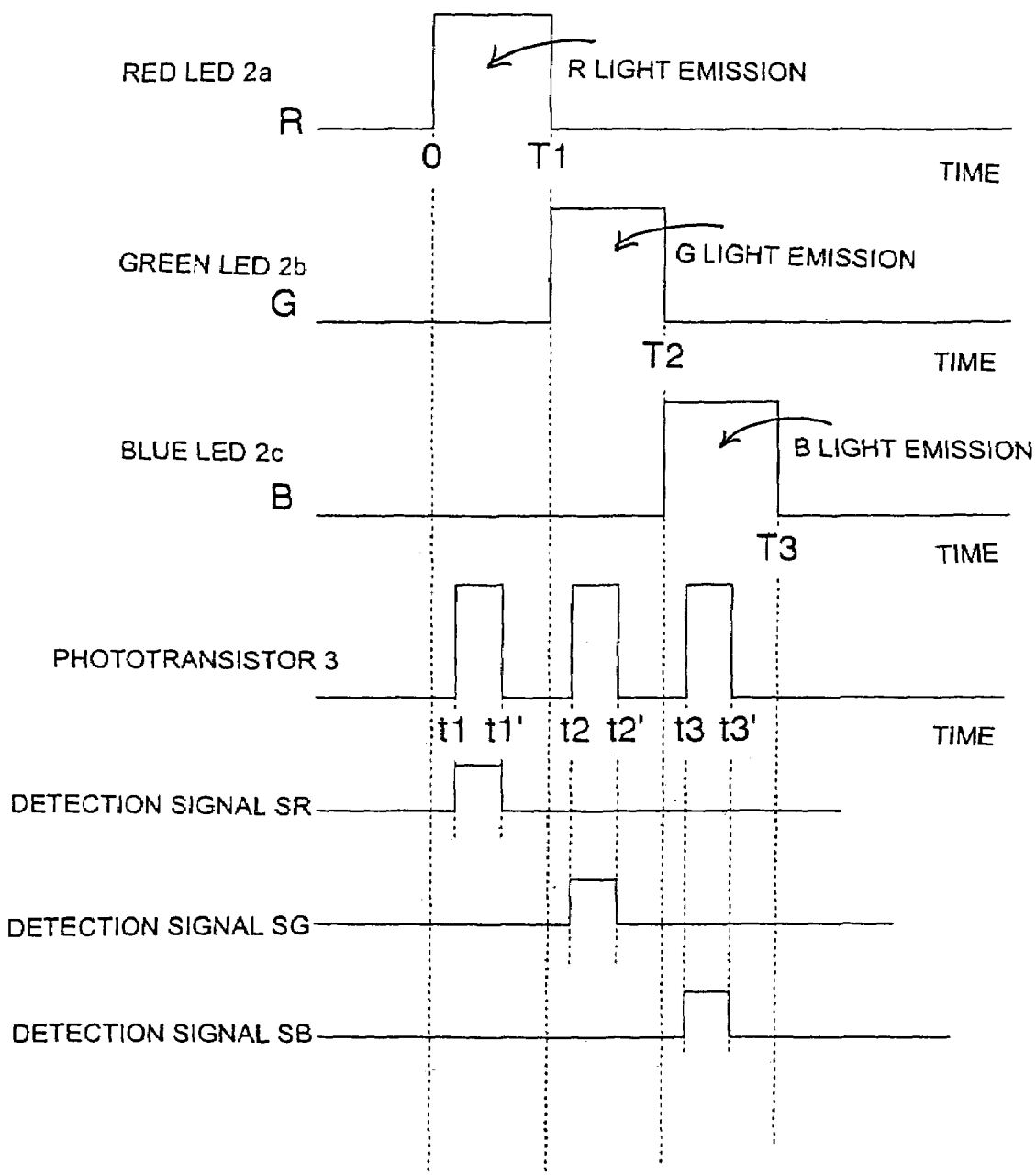
FIG. 5 shows an example of a time chart for current control in the invention.

FIG. 5 shows an example of the time chart of the current control in the invention.

In FIG. 5, light emission of the red LED 2a is made during 0 to time T1. The phototransistor 3 is operated from time t1 to t1' within this period to output the detection signal SR.

Light emission of the green LED 2b is made during the time T1 to T2. The phototransistor 3 is operated from time t2 to t2' within this period to output the detection signal SG.

Further, light emission of the blue LED 2c is made during the time T2 to T3. The phototransistor 3 is operated from time t3 to t3' within this period to output the detection signal SB.

Here, the light emission time of each LED may be about 5 msec and the detection time of the phototransistor 3 may be about 3 msec, for example.

When such light emission control is made, only one of the three colors is emitted in a certain instant. Even when the three LED are allowed to serially emit light in a cycle of about 15 msec, however, the white color appears to be emitted to human eyes due to synthetic light of three R, G and B colors because the human eyes have the after-image effect.

The detection signals SR, SG and SB are serially inputted as the signals deviated time-wise from one another to the control unit 11.

The control unit 11 stores in advance a value of the detection signal intensity as a reference (reference intensity value) for each color, determines the difference of this reference intensity value from the detection signal inputted and calculates a current correction value corresponding on the 1:1 basis to this difference.

A current calculated by taking this current correction value into account is applied to the LED of each color at the next light emission timing.

Because the light intensity is monitored and the current value is controlled as described above, the white color decided at the time of design can always be obtained stably.

Figure 6:
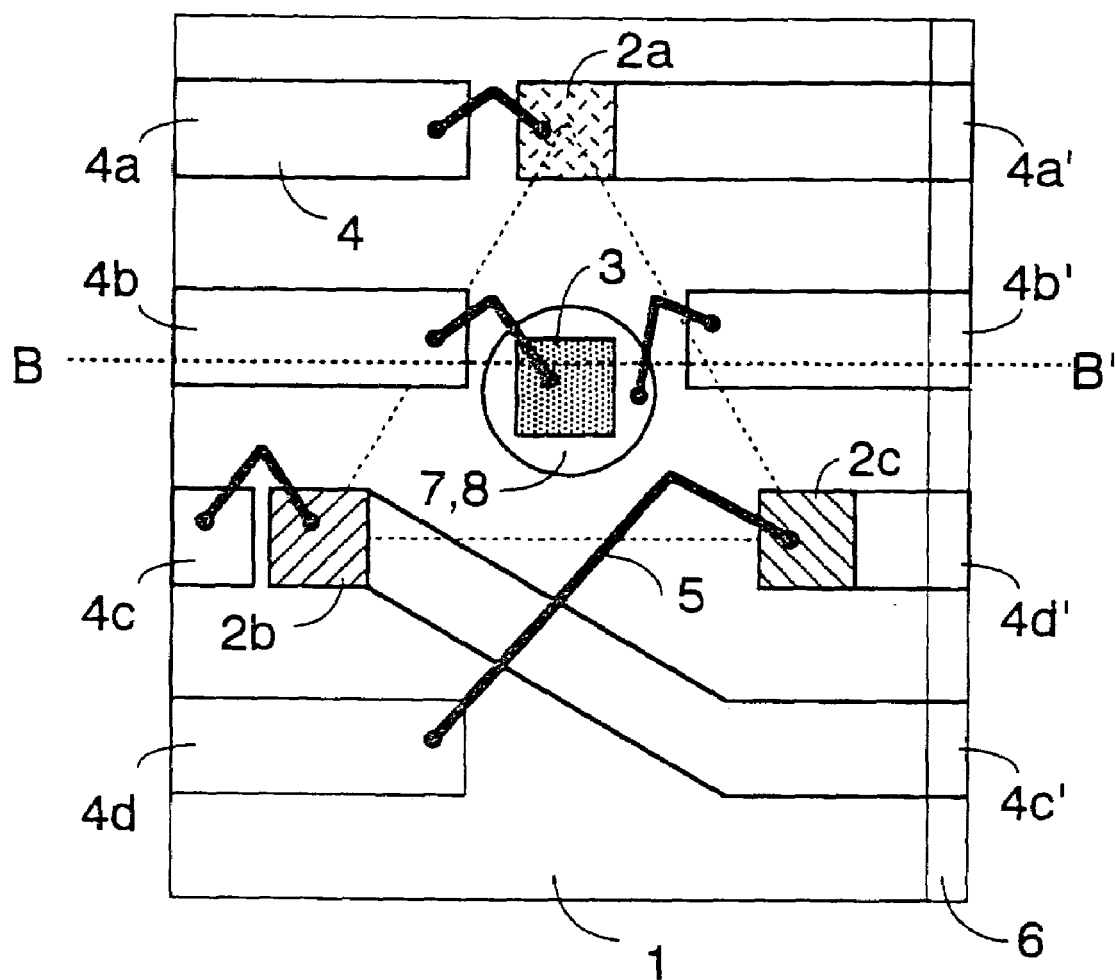
FIG. 6 is a structural view showing another example of the arrangement of a phototransistor in the light-emitting device of the invention.

FIG. 6 is a structural view of another arrangement example of the phototransistor of the light-emitting device according to the invention.

Figure 7:
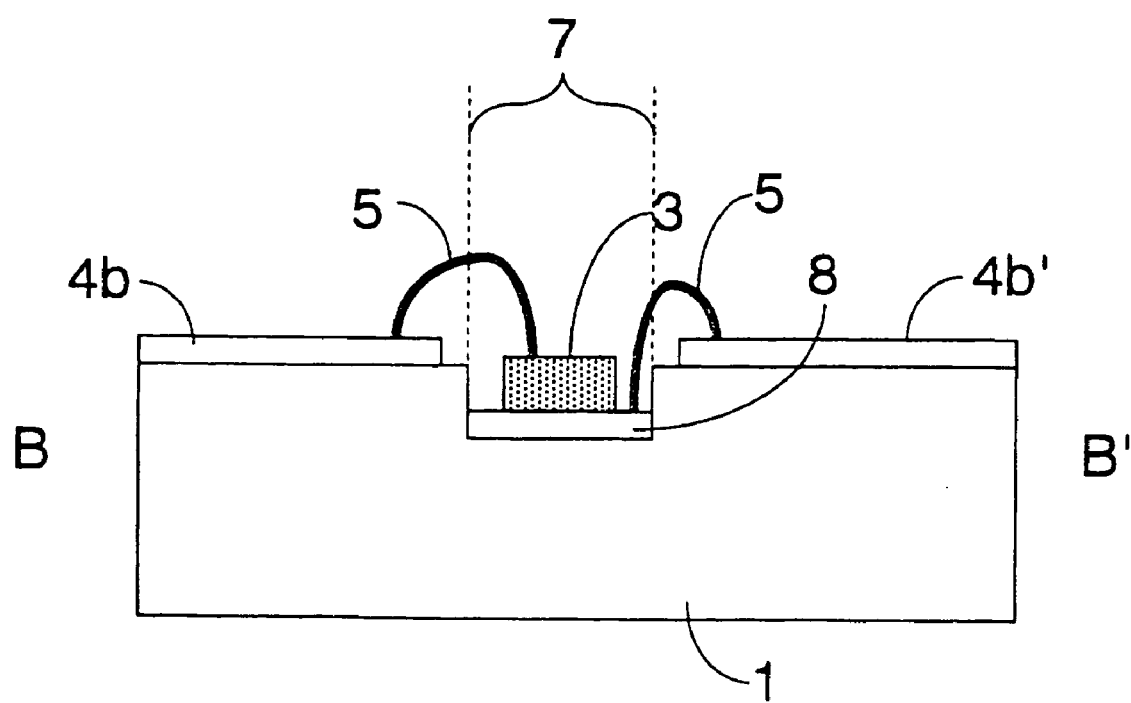
FIG. 7 is a sectional view of a section B–B' in FIG. 6.

FIG. 7 is a sectional view of a section B–B' in FIG. 6.

When each LED chip 2 and the phototransistor 3 are formed to the same height on the substrate 1 as shown in FIG. 3, the rays of light traveling towards the phototransistor 3 are reflected by the phototransistor 3 and some do not contribute to the sense of vision.

Incidentally, when the light-emitting device is used as backlight, the white color to be acquired is preferably as bright as possible. Therefore, the quantity of the rays of light that do not contribute to the sense of vision is preferably as small as possible.

In the light-emitting device shown in FIGS. 6 and 7, contrivance is made to the arrangement of the phototransistor 3 lest the rays of light traveling towards the phototransistor 3 are cut off by the phototransistor 3.

The positions of the LED 2 and the phototransistor 3 on the insulating substrate 1 as viewed in the plan view of FIG. 6 are the same as those in FIG. 1. However, a recess 7 is formed at the position at which the phototransistor 3 is to be arranged as shown in FIG. 7, and the phototransistor 3 is formed inside this recess 7.

Because the phototransistor 3 must detect a part of the rays of light emitted from each LED, the depth of the recess 7 is preferably 1 to 1.5 times the height of the phototransistor.

When the height of the phototransistor 3 is about 100 µm, for example, the depth of the recess 7 is preferably about 110 µm.

Incidentally, to secure electric connection between the phototransistor 3 and the wiring pattern 4, an electrically conductive layer 8 is formed below the phototransistor 3 in the recess 7 and is connected to the wiring pattern 4b' through the wire 5.

Light emission control of the LED and intensity adjustment by the detection signals in this case may be carried out in the same way as those shown in FIGS. 4 and 5.

The adjustment method of the light emission intensity is not limited to the method of the embodiment described above, but may be those which can independently measure the intensity of each light-emitting chip. It is possible, for example, to let each light-emitting chip emit light with a time lag among them, to subtract the output of the previous time from the sum output and to calculate the intensity of the light-emitting chip that later emits light.

In the embodiment described above, one phototransistor 3 detects light emission of the three LED. However, when these LED do not emit light, the phototransistor 3 may detect external light, that is, indoor illumination and solar rays.

A mobile terminal 1 is used at various places and is often used outdoors not only indoors.

In other words, the mobile terminal 1 is sometimes used inside a relatively dark room and sometimes under the bright solar rays, on the contrary. It is therefore preferred that the intensity of white color light used as backlight can be adjusted in such a manner as to correspond to the intensity of external light.

Figure 8:
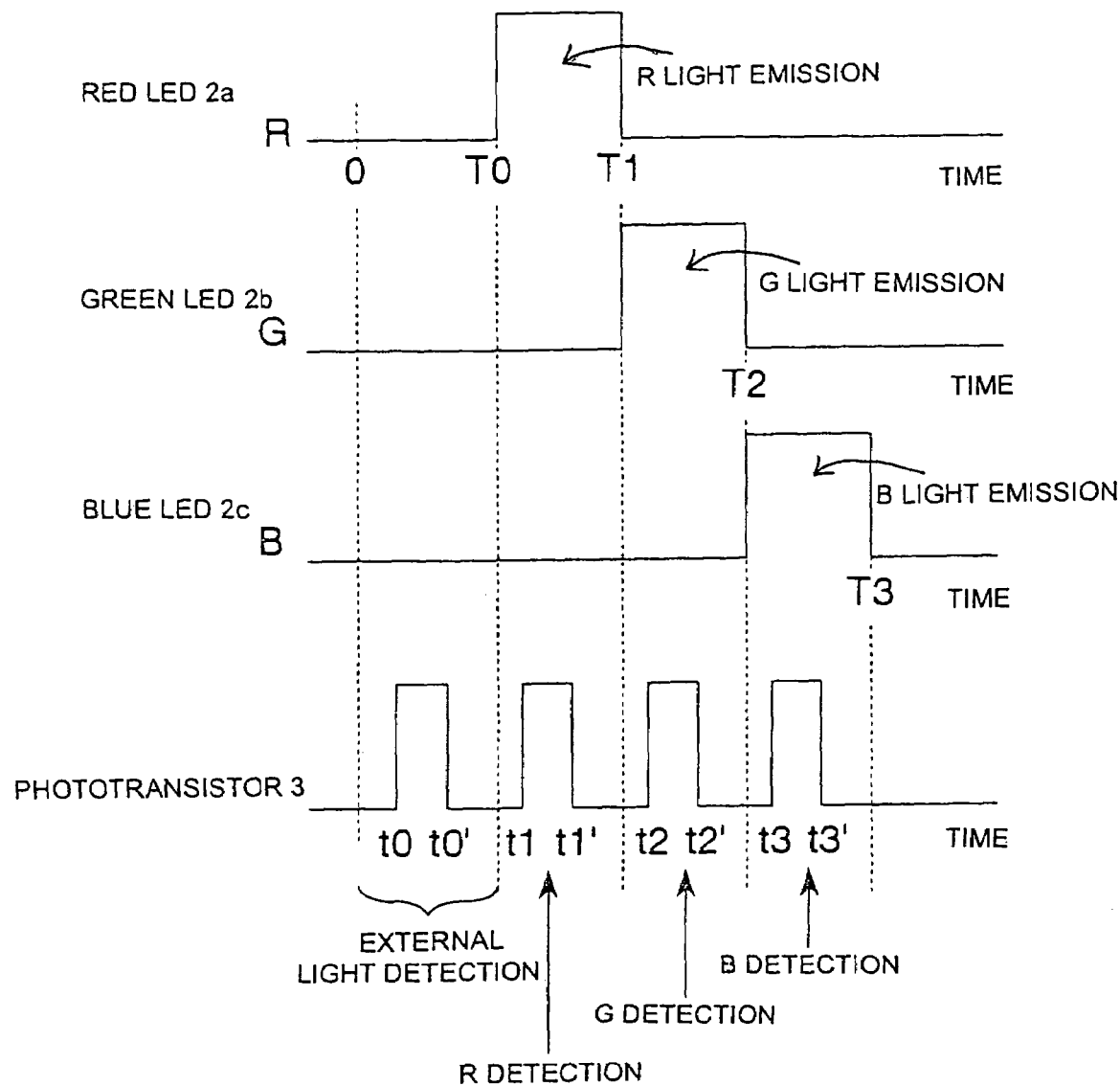
FIG. 8 shows an example of a time chart of current control including external light detection in the invention.

For example, one method that can be used increases the intensity of white color light inside a dark room and to lower it under the bright solar rays. Therefore, the light-emitting device may well be constituted in such a fashion that external light can be introduced into the chip areas shown in FIG. 1, the phototransistor 3 is operated immediately before the LED emits light or while the LED stops light emission, and the control unit 11 may well detect the detection signal (See FIG. 8).

The detection signal detected from external light is compared with a reference value for external light that is determined in advance are compared and an adjustment quantity of the light intensity is calculated in accordance with a predetermined calculation formula.

Brightness of white color light can be changed in such a manner as to correspond to the intensity of external light when light emission control of the LED is made on the basis of this adjustment quantity.

When the light-emitting device has a function of detecting external light, the light-emitting device of the invention can be used as a switch sensor on the basis of the presence/absence of detection of external light when it is applied to the backlight of a foldable cellular telephone unit.

In other words, when a construction in which the rays of light are prevented from being incident into the phototransistor 3 at the time of folding is employed, the sensor is under the closed state when external light is not detected and is under the open state when external light is detected.

The embodiment described above represents the light-emitting device having three light-emitting chips but the number of light-emitting chips is not limited to 3.

For example, the light-emitting device may have two light emitting chips, or 4 or more light-emitting chips, for example.

When the light-emitting device has two light-emitting chips such as one red color LED and one green color LED, light of at least three colors of red, orange and green can be emitted when light emission control of these two LED is made. When the light emission quantity of each LED is adjusted, light of neutral tints can be emitted by appropriately mixing these red and green colors.

When the light-emitting device has light-emitting chips of four colors such as when the light-emitting device has LED chips for emitting red, blue, green and emerald colors, respectively, light of various mixed colors can be emitted by adjusting the light emission quantities of these four LED.

Figure 9:
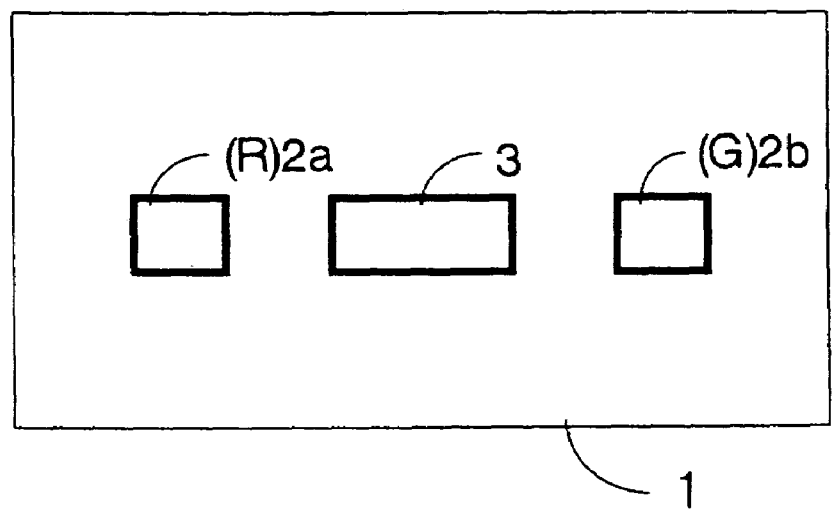
FIG. 9 is a structural view of an example having two LED in the light-emitting device according to the invention.

FIG. 9 is a schematic structural view of a light-emitting device having two light-emitting elements (LED chips) according to another embodiment.

FIG. 9 shows a construction in which a red color LED chip (2a), a green color LED chip (2b) and one phototransistor 3 are arranged on a line on one insulating substrate.

The phototransistor 3 is arranged at a substantial center of the segment connecting the two LED chips (2a, 2b). The phototransistor 3 is used for monitoring the light emission quantities.

The phototransistor 3 detects the quantities of light of red color light outputted from the red color LED 2a and green color light outputted from the green color LED 2b.

When this light-emitting device is used as a display device of three colors (red, orange and green), light emission control of the red color LED and the green color LED is simultaneously made. The phototransistor 3 detects the light emission quantity of the red color LED 2a and the light emission quantity of the green color LED 2b, and the tone of the emission colors can be adjusted by utilizing the result of detection. When the light emission quantities of red and green are controlled, various neutral tints between red and green can be displayed.

Figure 10:
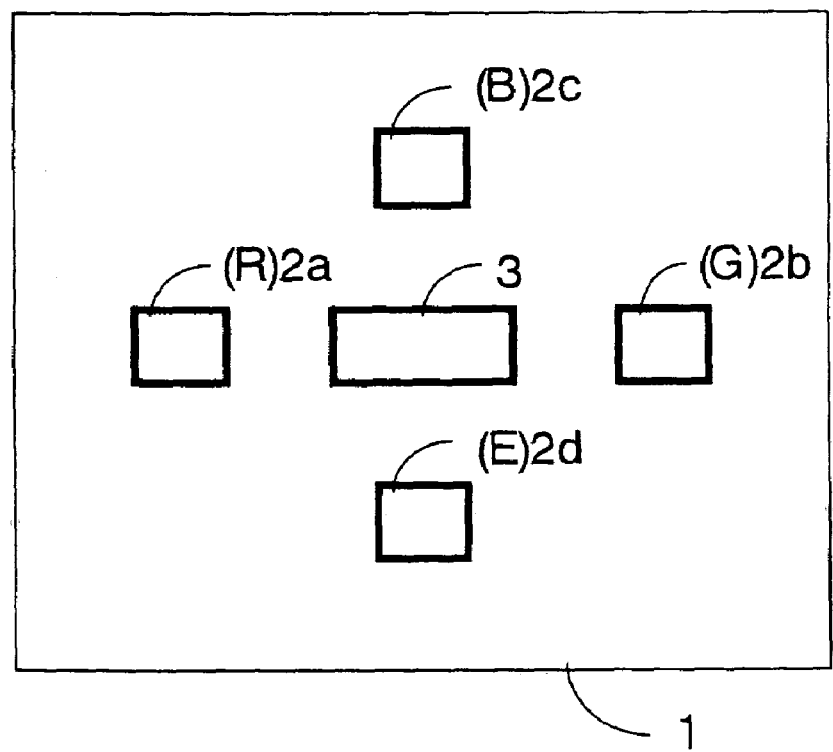
FIG. 10 is a structural view of an example having four LED in the light-emitting device according to the invention.

FIG. 10 is a schematic structural view of a light-emitting device having four light-emitting elements (LED chips) according to another embodiment. Here, four LED chips (red 2a, green 2b, blue 2c, emerald 2d) and one phototransistor 3 are arranged on one insulating substrate. The phototransistor 3 is disposed equidistantly from each LED chip and is used for monitoring the light emission quantity of each color. When light emission control of the LED of these four colors is made simultaneously, the four colors and various compound colors that can be created from these four colors can be displayed. The phototransistor 3 detects the light emission quantity of light outputted from each LED and the color balance of the light emission colors can be adjusted on the basis of the detection result.

When n (n≧2) LED chips are used, it is generally preferred to use the n LED chips all of which emit light of different colors, but some of the n LED may emit light of the same color. In other words, the light emission colors of the n LED may have an arbitrary combination depending on the application.

When the number n of the LED chips is 5 or more (n≧5), each LED chip may be positioned at the position of each apex of an equilateral n polygon having one phototransistor at its center.

When a plurality of LED chips and one phototransistor for detecting the light emission quantity of each color are disposed on the insulating substrate, the color balance of the light emission colors can be easily adjusted when the light-emitting device of the invention is used as the light-emitting device.

The mounting area of the phototransistor can be decreased when an Si substrate on which the phototransistor is formed is used as the substrate.

The explanation given above is made mainly on the assumption that the LED chips are mounted to the wiring substrate formed of an ordinary glass epoxy resin. However, the LED chips and the phototransistor may of course be mounted to a package produced by integrating a lead frame with a resin frame as described in Japanese Unexamined Patent Publication No. Hei 11(1999)-087780, an MID type package produced by molding an electrode pattern on a resin surface as described in Japanese Unexamined Patent Publication No. Hei 7(1995)-038154 and a package of a type in which electrodes are buried into a ceramic as described in Japanese Unexamined Patent Publication No. Hei 9(1997)-234728.

What is claimed is:

1. A light-emitting device comprising:
    a plurality of light-emitting elements configured to emit light of mutually different colors;
    at least one light-detecting element configured to detect light emitted from the light-emitting elements;
    the light-emitting elements and the light-detecting element being on a substrate, wherein the light-emitting elements comprise light-emitting chips configured to emit light of a first, second and third color, respectively;
    a light emission control portion configured to apply a current to the light-emitting chips thereby allowing the light-emitting chips to emit light at predetermined time intervals; and
    a light intensity adjustment portion configured to serially receive detection signals from the light-detecting element as to correspond to an intensity of incident light, analyze the detection signals and adjust the current applied to the light-emitting chips so that a predetermined color can be generated;
    wherein the light emission control portion is configured to allow the light-detecting element to detect external light incident on the light-detecting element in a time in which none of the light-emitting chips emit light, and the light intensity adjustment portion is configured to adjust from a first to a second on-zero value the current applied to each of the light-emitting chips by use of the detection signals based on the detected external light.

2. A light-emitting device according to claim 1, wherein the light-detecting element is arranged substantially equidistant from each of the light-emitting chips.

3. A light-emitting device according to claim 1, wherein the light-emitting elements are arranged at apexes of an equilateral triangle and the light-detecting element is arranged at the center of gravity of the equilateral triangle.

4. A light-emitting device according to claim 1, wherein the light-detecting element is arranged not to intercept light emitted from the light-emitting chips and directed away from the substrate.

5. A liquid crystal display device using the light-emitting device of claim 1 as a backlight.

* * * * *